(12) United States Patent
Nguyen et al.

(10) Patent No.: US 8,610,281 B1
(45) Date of Patent: Dec. 17, 2013

(54) DOUBLE-SIDED SEMICONDUCTOR STRUCTURE USING THROUGH-SILICON VIAS

(71) Applicant: GLOBALFOUNDRIES Inc., Grand Cayman, NY (US)

(72) Inventors: Andy T. Nguyen, San Jose, CA (US); Kuldeep Amarnath, San Jose, CA (US); Ravi P. Gutala, San Jose, CA (US)

(73) Assignee: GLOBAL FOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/633,234

(22) Filed: Oct. 2, 2012

(51) Int. Cl.
*H01L 23/52* (2006.01)

(52) U.S. Cl.
USPC .......................................... 257/770; 257/774

(58) Field of Classification Search
USPC .................................. 257/770, 774, E23.163
See application file for complete search history.

(56) References Cited

U.S. PATENT DOCUMENTS

| | | | |
|---|---|---|---|
| 6,495,454 B2 * | 12/2002 | Livengood et al. | 438/667 |
| 6,683,592 B1 * | 1/2004 | Murade | 345/87 |
| 2011/0248403 A1 * | 10/2011 | Chandrasekaran et al. | 257/770 |

* cited by examiner

*Primary Examiner* — Howard Weiss
*Assistant Examiner* — Steven Rao
(74) *Attorney, Agent, or Firm* — Hunter E. Webb; Keohane & D'Alessandro PLLC

(57) ABSTRACT

Methods and structures for a double-sided semiconductor structure using through-silicon vias (TSVs) are disclosed. The double-sided structure has functional circuits on both the front and back sides, interconnected by one or more TSVs. In some embodiments, multiple double-sided structures are combined to create 3D semiconductor structures with increased circuit density.

17 Claims, 8 Drawing Sheets

DOUBLE-SIDED SEMICONDUCTOR STRUCTURE USING THROUGH-SILICON VIAS

FIELD OF THE INVENTION

The present invention relates generally to semiconductor fabrication and, more particularly, to a double-sided semiconductor structure using through-silicon vias, and methods of fabrication.

BACKGROUND

With electronic devices, particularly portable devices such as mobile phones, becoming smaller and yet at the same time offering a wider range of functions, there is a need to integrate multifunctional chips without increasing the size of the devices and keeping a small form factor. Increasing the number of electronic components in a 2D structure is incompatible with these objectives, and therefore 3D packages are increasingly being adopted in order to provide greater functionality and higher component density with a small form factor.

In a 3D structure, electronic components such as semiconductor chips may be provided in a multilayer stacked structure. In this case, wafers or die may be "stacked" on one another. While 3D integration increases circuit density, it has various drawbacks, such as increased cost due to the use of additional wafers, increased testing time and cost, and increased assembly time and cost. It is therefore desirable to have improvements to increase circuit density.

SUMMARY

In general, embodiments of the invention provide approaches for a double-sided semiconductor structure using through-silicon vias (TSVs). The double-sided structure, having functional circuits on both the front and back sides, interconnected by one or more TSVs, provides increased circuit density, while making the fabrication and testing processes more efficient. In some embodiments, multiple double-sided structures are combined to facilitate improved 3D integration circuit density.

One aspect of the present invention includes a semiconductor wafer including a first side and a second side. A first circuit is formed on the first side, and a second circuit is formed on the second side. A through-silicon via (TSV) connects the first circuit and the second circuit.

Another aspect of the present invention includes a semiconductor structure which includes multiple dies stacked on each other. At least one of the die of the multiple dies includes a double-sided die that has a first side and a second side, with a first circuit formed on the first side, and a second circuit formed on a second side. The first circuit and second circuit are electrically connected via at least one through-silicon-via.

Another aspect of the present invention includes a method of fabricating a semiconductor structure. The method includes forming a first circuit on a first side of a semiconductor substrate, forming a through-silicon via connected to the first circuit, and forming a second circuit on a second side of the semiconductor substrate, connected to the through-silicon via.

BRIEF DESCRIPTION OF THE DRAWINGS

These and other features of this invention will be more readily understood from the following detailed description of the various aspects of the invention taken in conjunction with the accompanying drawings in which.

Figure 1:
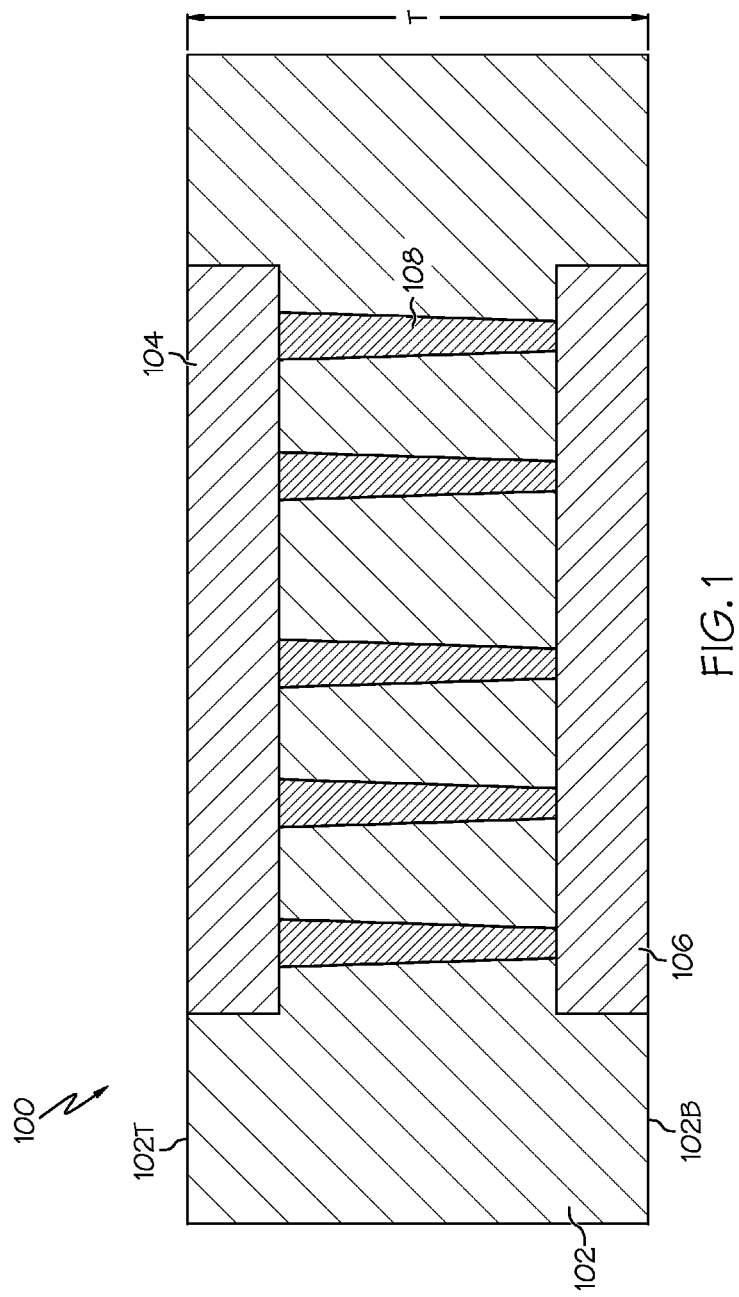
FIG. 1 shows a side view of an illustrative embodiment of the present invention.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. Exemplary embodiments of the invention provide approaches for a double-sided semiconductor structure using through-silicon vias (TSVs). Conventional TSVs are used to stack semiconductor substrates such as dies or semiconductor wafers to form 3D structures. Embodiments of the present invention utilize the top and bottom sides of a wafer (or die) for circuits. This has several advantages, including increasing circuit density, decreasing cost, and decreasing test time. Furthermore, with the double-sided structure utilized in embodiments of the present invention, shorter TSV column heights may be used, as the TSV need only connect to another circuit on the same wafer. Therefore, fabrication time and complexity for the TSVs are reduced.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment. The terms "overlying" or "atop", "positioned on" or "positioned atop", "underlying", "beneath", or "below" mean that a first element, such as a first structure (e.g., a first layer), is present on a second element, such as a second structure (e.g. a second layer), wherein intervening elements, such as an interface structure (e.g. an interface layer), may be present between the first element and the second element.

Referring now to FIG. 1, a side view of a semiconductor structure 100 of an illustrative embodiment of the present invention is shown. Structure 100 includes bulk substrate 102, which may be made of silicon. The bulk substrate 102 may be in the form of a die or wafer that contains many dies. The structure 102 includes a first electronic circuit 104 formed on the top side 102T of the substrate 102. The structure 102 includes a second electronic circuit 106 formed on the bottom side 102B of the substrate 102. The first circuit 104 and second circuit 106 are electrically connected by one or more through-silicon vias (TSVs) 108. In some embodiments, the thickness T of substrate 102 may range from about 10 micrometers to about 100 micrometers. In other embodiments, the thickness T of substrate 102 may range from about 50 micrometers to about 75 micrometers. In still other embodiments, the thickness T of substrate 102 may range from about 20 micrometers to about 45 micrometers.

In some embodiments first circuit 104 may include a plurality of circuit elements such as field effect transistors, capacitors, diodes, resistors, and other circuit elements such as interconnects, which make up a logic circuit. Second circuit 106 may contain similar circuit elements for an additional logic circuit. In some embodiments, second circuit 106 contains capacitors. The capacitors may be used in applications such as decoupling, power distribution, input-output (I/O) circuitry protection, electrostatic discharge (ESD) protection, and Single Event Upset (SEU) applications. In the case of SEU, large capacitors on the second circuit 106 can address SEU with a 6-T SRAM cell, serving as an alternative to using a more costly 18-T SRAM cell. In some embodiments, non-timing critical circuitry, such as Design For Test (DFT), Design For Manufacturing (DFM), and JTAG scan chains are formed on the "bottom" circuit 106. By using the second circuit 106 for elements such as ESD, power distribution, and the like, valuable real estate in the first circuit 104 is preserved.

Figure 2A:
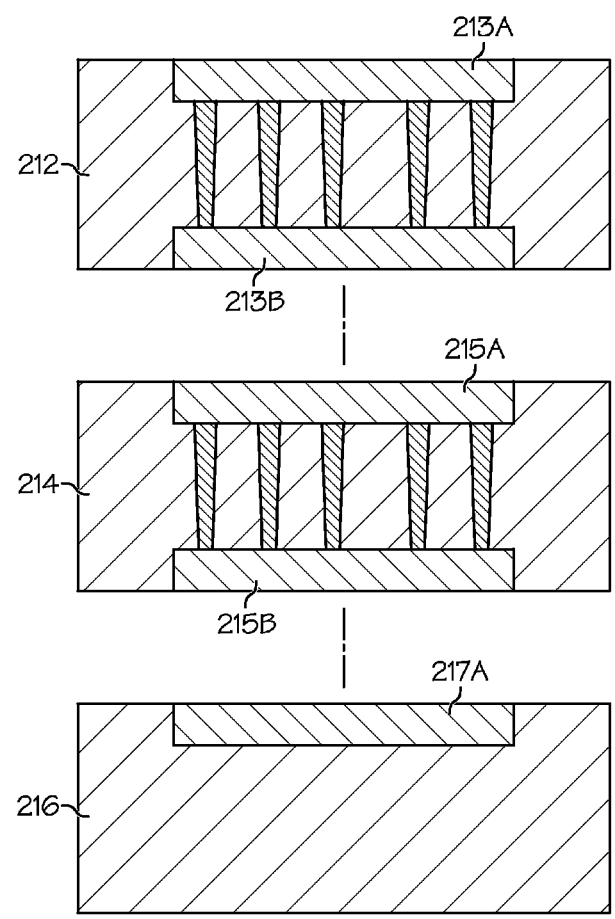
FIG. 2A shows an exploded side view of an additional illustrative embodiment of the present invention.

FIG. 2A shows an exploded side view of an additional illustrative embodiment of the present invention. In this exploded view, three semiconductor structures are shown. Structures 212 and 214 are double-sided semiconductor structures similar to that shown as 100 in FIG. 1, having a circuit on both the top and bottom sides. Structure 216 is a conventional single-sided structure, having a circuit only on one side. Structure 212 includes first circuit 213A on one side of the structure and second circuit 213B on the opposite side. Structure 214 includes first circuit 215A on one side of the structure and second circuit 215B on the opposite side. Structure 216 has one circuit 217A on the top side with no circuit on the opposite side.

Figure 2B:
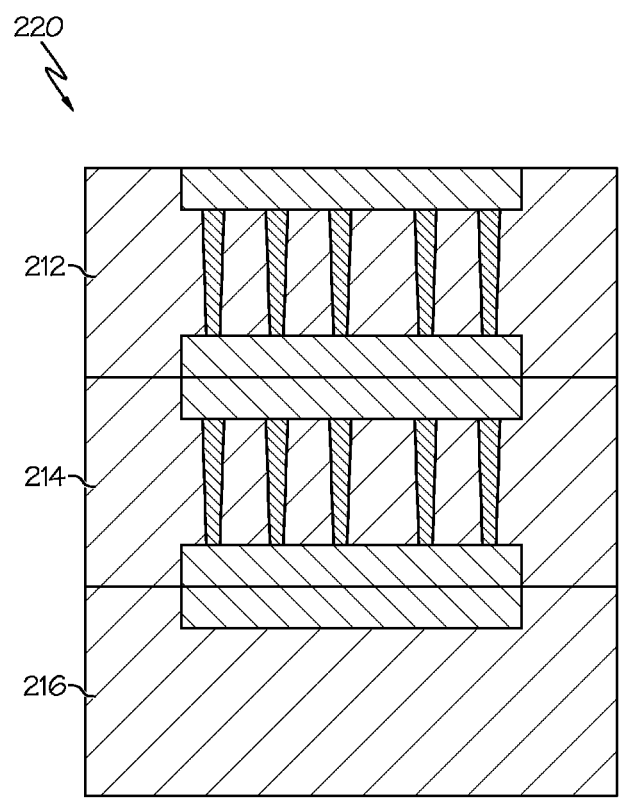
FIG. 2B shows an assembled side view of an additional illustrative embodiment of the present invention.

FIG. 2B shows an assembled side view of a multi-layered 3D semiconductor structure 220 in accordance with an additional illustrative embodiment of the present invention. Multi-layered 3D semiconductor structure 220 includes double-sided structure 212 disposed over double-sided structure 214, which is disposed over single-sided structure 216.

Figure 3A:
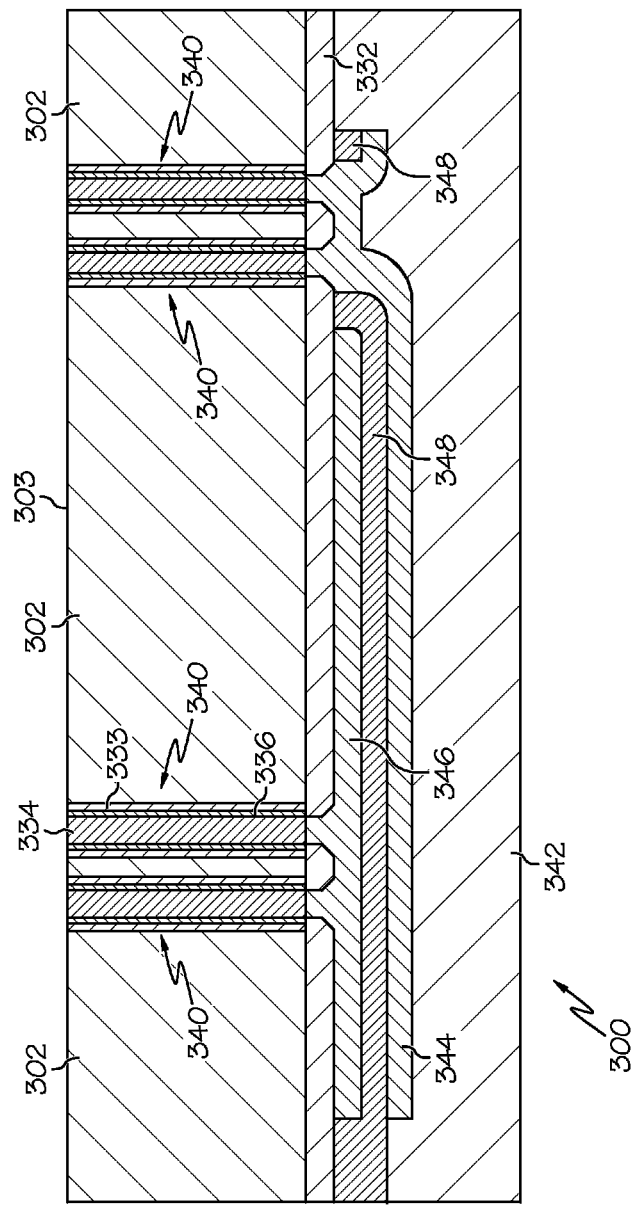
FIG. 3A shows details of a circuit in accordance with illustrative embodiments of the present invention.

FIG. 3A shows details of a circuit 300 in accordance with illustrative embodiments of the present invention. Circuit 300 is a capacitor which includes a first electrode 344 and a second electrode 346. Disposed between first electrode 344 and second electrode 346 is a dielectric layer 348. The dielectric layer 348 may be a high-K dielectric layer with a dielectric constant greater than 7. In embodiments, the high-K dielectric layer has a dielectric constant in the range of 7 to 90. In some embodiments, the high-K dielectric layer 348 is made from a material such as hafnium oxide (HfO2) or zirconium oxide (ZrO2).

The first electrode 344, second electrode 346 and dielectric layer 348 are disposed over an oxide layer 332. Oxide layer 332 is disposed over bulk substrate 302, which may comprise the silicon of the initial wafer or die. Multiple TSVs 340 connect to the capacitor electrodes. In this embodiment, two TSVs 340 connect to first electrode 344 and two TSVs 340 connect to second electrode 346. Each TSV 340 is made by forming a void within substrate 302. An oxide layer 333 may be formed on the interior of each void. A barrier layer 336 may be formed over the oxide layer 333. The barrier layer 336 may include a substance such as Ta, Ti, TiN, TiSiN, WN, or manganese nitride (Mn4N). The barrier layer serves to prevent diffusion of the fill metal 334. The fill metal 334 may include tungsten or copper.

As further shown in FIG. 3A, edge 303 of substrate 302 is the top surface of the wafer/die. Circuit 300 may be used as some or all of the implementation of circuit 106 of structure 100 shown in FIG. 1. If there is no additional wafer or die to be affixed to the structure, then a protective, insulator layer 342 may be deposited over the first electrode 344, second electrode 346 and dielectric layer 348, and cover the entire circuit on the bottom side of the structure (e.g. 106 of FIG. 1). In one embodiment, the insulator layer 342 is comprised of undoped silicate glass (USG). In another embodiment, the insulator layer 342 is comprised of oxide. In another embodiment, the insulator layer 342 is comprised of a layer of oxide and a layer of nitride. Other materials may be used without departing from the scope and purpose of embodiments of the present invention.

If the circuit 300 is to be attached to another wafer/die, then the insulator layer 342 may be omitted. Alternatively, the insulator layer 342 may be sacrificial, and may be removed prior to adhering the next wafer/die to circuit 300.

Figure 3B:
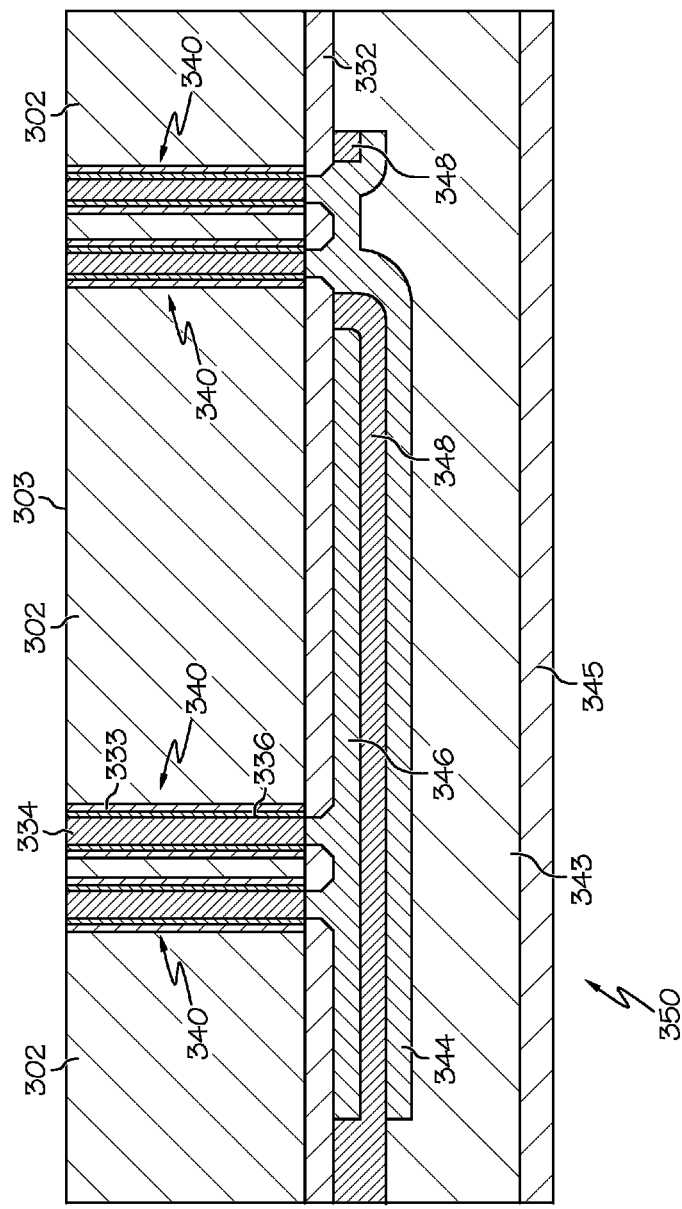
FIG. 3B shows details of a circuit in accordance with alternative illustrative embodiments of the present invention.

FIG. 3B shows details of a circuit 350 in accordance with alternative illustrative embodiments of the present invention. Circuit 350 is similar to circuit 300, except that the protective insulator region is made of oxide layer 343, with a second layer 345 disposed over the oxide layer. The second layer 345 may be a nitride layer.

Figure 4:
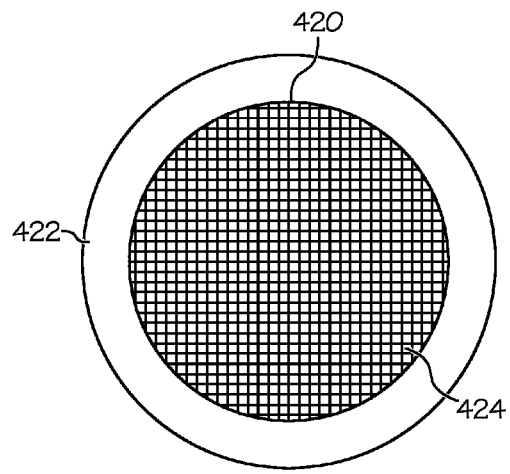
FIG. 4 is a top-down view of a wafer holder used in accordance with illustrative embodiments of the present invention.

Since embodiments of the present invention provide a double-sided wafer, with circuits on both the top and the bottom of the wafer, it is desirable to exploit the common wafer for both circuits, and process both sides of the wafer simultaneously. To accomplish this, a ring holder 422 may be used to hold a wafer 420, such that both sides of the wafer 420 are exposed, as shown in FIG. 4. The wafer 420 contains multiple die 424 which are double-sided. In some embodiments, the ring holder 422 may utilize center points (not shown). In other embodiments (as shown in FIG. 4), no center points are used.

Figure 5:
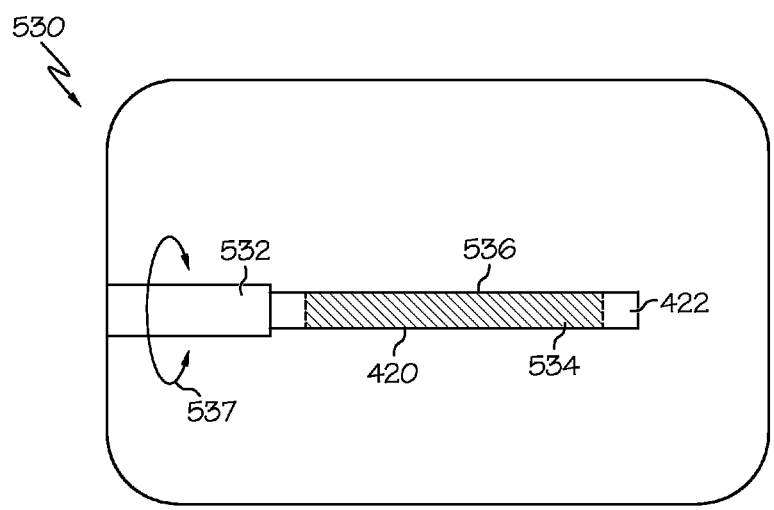
FIG. 5 shows simultaneous processing of two wafer sides in accordance with illustrative embodiments of the present invention.

FIG. 5 shows simultaneous processing of two wafer sides in accordance with illustrative embodiments of the present invention. A processing chamber 530 contains a chuck 532 which holds ring holder 422, which in turn secures wafer 420. The top side 536 and bottom side 534 are both exposed to the processing within chamber 530. Chuck 532 may include the capability to rotate 180 degrees around its axis in direction 537 to expose the top side 536 or bottom side 534 for processing using traditional equipment that works with only one side of a wafer. The processing occurring simultaneously within chamber 530 may include, but is not limited to, etching, blanket deposition, and lithography/patterning processes. While it may not be suitable to process the entire wafer in a parallel manner (both sides at the same time), it may be advantageous to perform at least some steps in parallel, such as certain etch cycles, to save time and cost.

Figure 6:
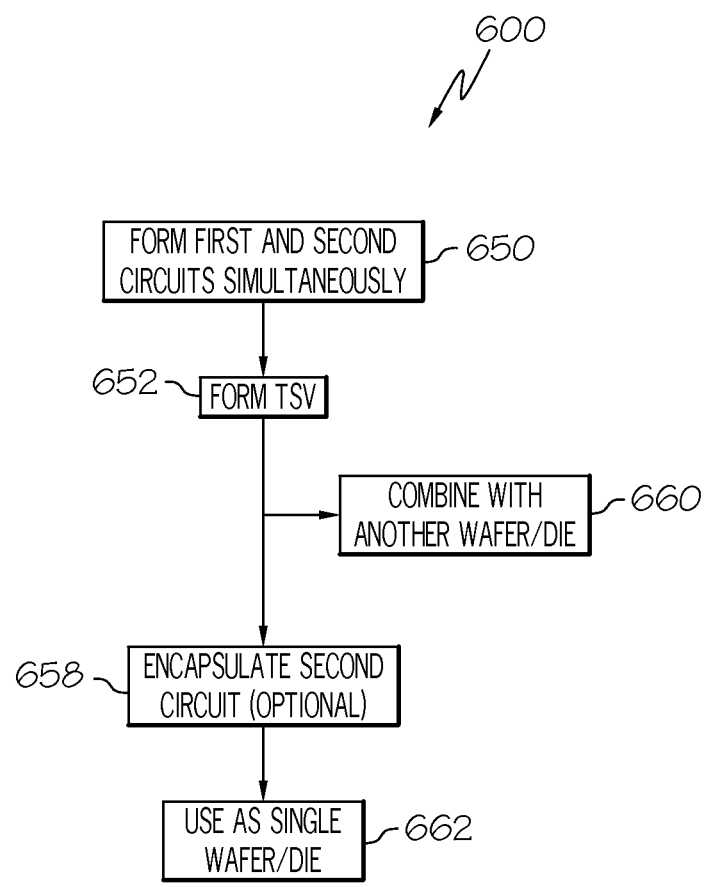
FIG. 6 is a flowchart showing process steps according to illustrative embodiments of the present invention.

FIG. 6 is a flowchart 600 showing process steps according to illustrative embodiments of the present invention. In process step 650, a first circuit and second circuit are formed simultaneously (as shown in chamber 530 of FIG. 5). In process step 652, TSVs are formed (see 108 of FIG. 1). Forming TSVs may include performing an anisotropic etch such as a deep reactive ion etch (DRIE), which may comprise a Bosch etch to form a long void extending deep into the bulk substrate (e.g. silicon). A barrier layer such as Ta, Ti, TiN, TiSiN, WN, or manganese nitride (Mn4N) may line the interior walls of the void. A metal, such as copper or tungsten is then used to fill the void. The metal may be deposited via chemical vapor deposition, electroplating, or other suitable technique. Seed layers may be used during this process, as is known in the industry. In one embodiment, the flow proceeds to process step 660, where the double-sided wafer is combined with another wafer (as shown in FIG. 2B).

Alternatively, in process step 658, the second circuit is encapsulated with a protective insulator layer (see 342 of FIG. 3A). In process step 662, the wafer/die is used alone, without combining it with additional wafers/dies. Alternatively, in some embodiments, an encapsulated circuit may be used with a multi-layer structure, where the encapsulated circuit is on the top or the bottom of the multi-layer structure.

Figure 7:
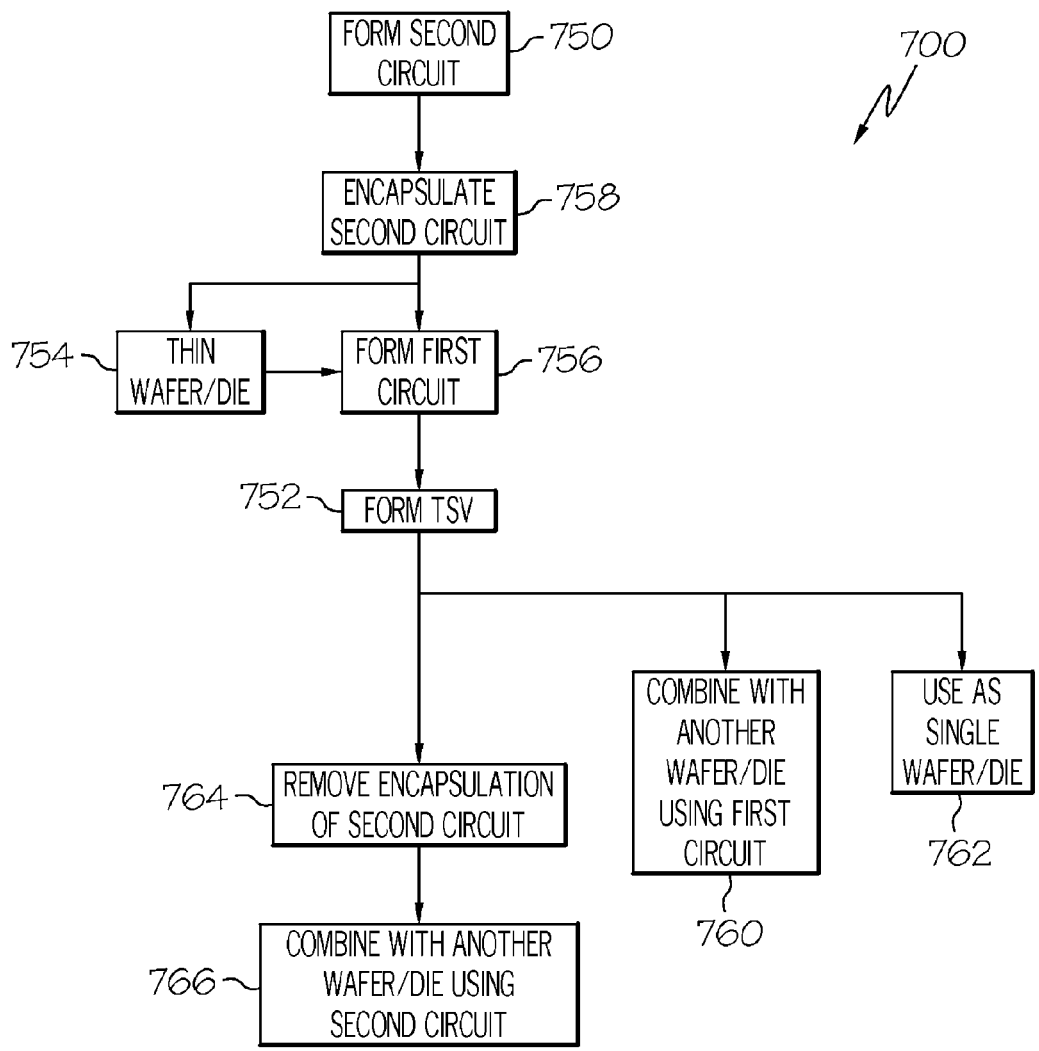
FIG. 7 is a flowchart showing process steps according to additional illustrative embodiments of the present invention.

FIG. 7 is a flowchart 700 showing process steps according to alternative illustrative embodiments of the present invention. In process step 750, the second circuit is formed (see 300 of FIG. 3A). In process step 758, the second circuit is encapsulated (see 342 of FIG. 3A). Optionally, the wafer/die may be thinned at some point during the fabrication process as indicated by step 754. In process step 756, a first circuit is formed (see 104 of FIG. 1). In process step 752, TSVs are formed (see 108 of FIG. 1). In one embodiment, the wafer/die is used as a single wafer/die in process step 762. In another embodiment, the flow proceeds to process step 760, and the wafer/die is combined with another wafer/die via the first circuit (see 215A of FIG. 2A). In another embodiment, the flow proceeds to process step 764, and the encapsulation of the second circuit is removed. The flow then proceeds to process step 766 where wafer/die is combined with another wafer/die via the second circuit (see 215B of FIG. 2A). While flowchart 700 shows the second circuit being formed in step 750 and the first circuit being formed in step 756, embodiments of the present invention may also form the first circuit prior to forming the second circuit.

In various embodiments, design tools can be provided and configured to create the datasets used to pattern the semiconductor layers as described herein. For example data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided approaches for a double-sided semiconductor structure using through-silicon vias (TSVs). The double-sided structure, having functional circuits on both the front and back sides, interconnected by one or more TSVs, provides increased circuit density, while making the fabrication and testing processes more efficient. Furthermore, by having the first and second circuits on the same die, it can reduce capacitance load, and result in faster timing and less power consumption.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor wafer comprising a first side and a second side, wherein:
   a first circuit is formed on the first side;
   a second circuit is formed on the second side; and
   wherein a plurality of through-silicon vias connects the first circuit and the second circuit, and wherein the second circuit comprises a capacitor having a first electrode and a second electrode, a dielectric layer disposed between the first electrode and second electrode, an oxide layer disposed between the semiconductor wafer and the first electrode, and an oxide layer disposed between the semiconductor wafer and the first electrode.

2. The wafer of claim 1, wherein the second circuit is covered by an insulator region.

3. The wafer of claim 2, wherein the insulator region is comprised of undoped silicate glass.

4. The wafer of claim 2, wherein the insulator region is comprised of oxide.

5. The wafer of claim 4, wherein the insulator region further comprises a nitride layer.

6. The semiconductor wafer of claim 1, wherein the through-silicon via is filled with copper.

7. The semiconductor wafer of claim 6, wherein the through-silicon via comprises a barrier layer, wherein the barrier layer is comprised of a material selected from the group consisting of: Ta, Ti, TiN, TiSiN, WN, and manganese nitride (Mn4N).

8. The semiconductor wafer of claim 1, wherein the first electrode and second electrode are comprised of copper.

9. The semiconductor wafer of claim 1, wherein the first electrode and second electrode are comprised of TiN.

10. The semiconductor wafer of claim 1, wherein the dielectric layer disposed between the first electrode and second electrode is a high-K dielectric.

11. The semiconductor wafer of claim 1, wherein the plurality of through-silicon vias comprises two through-silicon vias connected to the first electrode, and two through-silicon vias connected to the second electrode.

12. A semiconductor structure, comprising a plurality of dies stacked on each other, wherein at least one die of the plurality of dies comprises a double-sided die comprising a first side and a second side, with a first circuit formed on the first side, a second circuit formed on a second side, wherein the first circuit and second circuit are electrically connected via at least one through-silicon-via, and wherein the second circuit comprises a capacitor comprising a first electrode and a second electrode, and a dielectric layer comprised of hafnium oxide disposed between the first electrode and second electrode, and an oxide layer disposed between the semiconductor wafer and the first electrode.

13. The semiconductor structure of claim 12, wherein one die of the plurality of dies comprises a single sided die.

14. A method of fabricating a semiconductor structure comprising:
   forming a first circuit on a first side of a semiconductor substrate;
   forming a through-silicon via, connected to the first circuit; and
   forming a second circuit on a second side of the semiconductor substrate, connected to the through-silicon via, wherein forming the second circuit comprises:
      forming a capacitor comprising a first electrode and a second electrode;
      forming a dielectric layer comprised of hafnium oxide disposed between the first electrode and second electrode; and
      forming an oxide layer disposed between the semiconductor wafer and the first electrode.

15. The method of claim 14, further comprising processing the first side of the semiconductor substrate and the second side of the semiconductor substrate simultaneously, wherein the processing comprises:
   securing the semiconductor substrate in a ring holder; and
   simultaneously performing a blanket deposition on the first side and second side of the semiconductor substrate.

16. The method of claim 14, further comprising covering the second circuit in an insulator layer.

17. The method of claim 16, wherein covering the second circuit in an insulator layer comprises covering the second circuit in a layer of undoped silicate glass.

\* \* \* \* \*

UNITED STATES PATENT AND TRADEMARK OFFICE
CERTIFICATE OF CORRECTION

PATENT NO. : 8,610,281 B1  Page 1 of 1
APPLICATION NO. : 13/633234
DATED : December 17, 2013
INVENTOR(S) : Nguyen et al.

It is certified that error appears in the above-identified patent and that said Letters Patent is hereby corrected as shown below:

Title page, item (73) Assignee:

Delete "GLOBAL FOUNDRIES Inc." and Insert -- GLOBALFOUNDRIES Inc. --.

Signed and Sealed this
Fifth Day of August, 2014

Michelle K. Lee
*Deputy Director of the United States Patent and Trademark Office*